United States Patent

Yamagishi

[11] Patent Number: 6,022,767
[45] Date of Patent: *Feb. 8, 2000

[54] SEMICONDUCTOR DEVICE WITH INSULATED GATE ELECTRODE AND METHOD OF FABRICATING THE SAME

[75] Inventor: Kazuo Yamagishi, Shiga, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/143,377

[22] Filed: Aug. 28, 1998

[30] Foreign Application Priority Data

Aug. 28, 1997 [JP] Japan .................................. 9-231888

[51] Int. Cl.⁷ .................................................. H01L 21/336
[52] U.S. Cl. ........................................... 438/197; 438/270
[58] Field of Search ............................. 257/330; 438/197, 438/270

[56] References Cited

U.S. PATENT DOCUMENTS

| | | | |
|---|---|---|---|
| 5,034,785 | 7/1991 | Blanchard | 257/330 |
| 5,298,780 | 3/1994 | Harada | 257/330 |
| 5,719,409 | 2/1998 | Singh et al. | 257/330 |
| 5,770,878 | 6/1998 | Beasom | 257/330 |

Primary Examiner—Kevin M. Picardat
Attorney, Agent, or Firm—Foley & Lardner

[57] ABSTRACT

There is provided a method of fabricating a semiconductor device, including the steps of (a) sequentially forming an epitaxial layer and a first insulating film on a semiconductor substrate, (b) forming the epitaxial layer with a recess, (c) forming a gate insulating film on an inner wall of the recess, (d) forming a polysilicon film so that the recess is filled with the polysilicon film, (e) etching back the polysilicon film so that a gate electrode having a thickness smaller than a depth of the recess is formed in the recess, (f) oxidizing the gate electrode at its surface with the first insulating film being used as a mask, to thereby form a third insulating film on the gate electrode, (g) forming a base region at a surface of the epitaxial layer with the third insulating film being used as a mask so that the base region has a thickness smaller than a depth of the recess, the base region having an electrical conductivity different from that of the epitaxial layer, (h) forming a source region at a surface of the base region with the third insulating film being used as a mask, the source region having the same electrical conductivity as that of the epitaxial layer, (i) exposing the base and source regions with the third insulating film being used as a mask, and (j) forming a source electrode over the third insulating film, the base region, and the source region. The method makes it no longer necessary to carry out a step of using a photoresist mask for forming a gate electrode and a step of using a photoresist mask for forming a contact between a source electrode and a source region.

10 Claims, 4 Drawing Sheets

SEMICONDUCTOR DEVICE WITH INSULATED GATE ELECTRODE AND METHOD OF FABRICATING THE SAME

BACKGROUND OF THE INVENTION

1. Field of the Invention

The invention relates to a semiconductor device having an insulated gate electrode, and further to a method of fabricating the same.

2. Description of the Related Art

FIG. 1 illustrates a conventional MOSFET formed at a surface thereof with a U-shaped recess.

The illustrated MOSFET includes an $n^+$ semiconductor substrate 1, on which an $n^-$ epitaxial layer 2 is formed. The $n^-$ epitaxial layer 2 is formed at a surface thereof with a p-type base region 3, at a surface of which is formed an $n^+$ source region 4. The $n^-$ epitaxial layer 2 other than the p-type base region 3 constitutes a drain region 2a.

The $n^-$ epitaxial layer 2 is formed with a U-shaped recess 5 starting from a surface of the source region 4 and reaching the drain region 2a through the base region 3. The recess 5 and a part of the source region 4 are covered with a gate oxide film 6, on which a gate electrode 7 is formed. An interlayer insulating film 8 is formed on the gate electrode 7 and the gate oxide film 6 so that the gate electrode 7 is entirely covered with the interlayer insulating film 8. The source region 4 and the base region 3 make electrical contact with a source electrode (not illustrated) at a surface of the base region 3 and also at a portion of a surface of the source region 4 on which the interlayer insulating film 8 is not formed.

A method of fabricating the above-mentioned conventional MOSFET is explained hereinbelow with reference to FIGS. 2A to 2C.

As illustrated in FIG. 2A, the $n^-$ epitaxial layer 2 is formed in the $n^+$ semiconductor substrate 1. Then, a silicon dioxide film 10 is formed at a surface of the epitaxial layer 2 by thermal oxidation, and a silicon nitride film 11 is formed all over the silicon dioxide film 10 by chemical vapor deposition (CVD). The silicon nitride film 11 acts as a mask for preventing growth of the silicon dioxide film 10. Thereafter, the silicon nitride film 11, the silicon dioxide film 10, and the epitaxial layer 2 are etched at a selected region by photolithography and dry etching to thereby form a recess 5.

Then, as illustrated in FIG. 2B, the recess 5 is thermally oxidized to thereby form LOCOS oxide film 13 in the recess 5. At the same time, the rectangular recess 5 is changed into a U-shaped recess. Then, the silicon nitride film 11 is completely removed by wet etching. Then, the semiconductor substrate 1 is ion-implanted with boron with LOCOS dioxide film 13 being used as a mask, followed by annealing for thermal diffusion of boron to thereby form the p-type base region 3 in the epitaxial layer 2.

Then, arsenic is ion-implanted into the base region 3 with both LOCOS dioxide film and a photoresist film (not illustrated) being used as a mask, followed by annealing for thermal diffusion of arsenic to thereby form the $n^+$ source region 4. The epitaxial layer 2 other than the base region 3 and the source region 4 constitutes the $n^-$ drain region 2a.

Then, as illustrated in FIG. 2C, LOCOS oxide film 13 and the silicon dioxide film 10 are removed by wet etching to thereby expose the base region 3, the source region 4, and the recess 5. Then, a gate oxide film 6 is formed on both an inner wall of the recess 5 and surfaces of the base region 3 and the source region 4 by thermal oxidation. A polysilicon layer 15 is formed all over the epitaxial layer 2 by CVD.

Then, as illustrated in FIG. 1, the polysilicon film 15 is patterned by photolithography and dry etching so that the polysilicon film 15 remained unetched only in the recess 5 and on a part of surface of the source region 4, to thereby form the gate electrode 7. Thereafter, the epitaxial layer 2 is covered at a surface thereof with the interlayer insulating film 8 by CVD.

Then, there is formed a contact in the interlayer insulating film 8 and the gate oxide film 6 so that a surface of the base region 3 and a part of a surface of the source region 4 are exposed. Then, the epitaxial layer 2 is entirely covered with an aluminum film by sputtering, followed by removal of the aluminum film in a selected region by photolithography and dry etching, to thereby form a source electrode (not illustrated) which makes electrical contact with both the base region 3 and the source region 4.

In the above-mentioned method, it is necessary to carry out steps of photolithography and etching for forming the gate electrode 7 of the polysilicon film 15 and also for making a contact between the source electrode and the source region 4. Hence, it is also necessary to have a registration margin for a photoresist mask when the above-mentioned photolithography steps are carried out. This causes a problem that it is quite difficult to form the source region small.

Japanese Unexamined Patent Publication No. 4-258174 published on Sep. 14, 1992 has suggested a semiconductor device including a semiconductor substrate formed at a surface thereof with a trench recess, a gate oxide film covering inner and bottom walls of the recess therewith, a first polysilicon film formed in the trench recess, and a second polysilicon film surrounded by the first polysilicon film for planarizing the trench recess, and an oxide film formed only on a gate electrode for electrically insulating the first polysilicon film from source region.

However, the method suggested in the above-mentioned Publication has the same problem as mentioned above. That is, it is quite difficult to form a source region smaller because of necessity of a registration margin for a photoresist mask.

SUMMARY OF THE INVENTION

In view of the above-mentioned problem in the conventional semiconductor devices, it is an object of the present invention to provide a field effect transistor and a method of fabricating the same both of which are capable of making it no longer necessary to carry out photolithography steps for forming a gate electrode, and for making a contact between a source electrode and a source region.

In one aspect of the present invention, there is provided a semiconductor device including (a) a semiconductor region formed at a surface thereof with a recess and including a drain region having a first electrical conductivity, a base region having a second electrical conductivity, and a source region having a first electrical conductivity, an interface between the drain region and the base region being at the level within a depth of the recess, and an interface between the base region and the source region being at the level within a depth of the recess, (b) a first insulating film formed on an inner wall of the recess, (c) a gate electrode formed in the recess and having a thickness smaller than a depth of the recess, and (d) a second insulating film formed on the gate electrode.

There is further provided a semiconductor device including (a) a semiconductor substrate, (b) an epitaxial layer formed on the semiconductor substrate, the epitaxial layer being formed at a surface thereof with a recess and including a drain region having a first electrical conductivity, a base region having a second electrical conductivity, and a source region having a first electrical conductivity, an interface between the drain region and the base region being at the level within a depth of the recess, and an interface between the base region and the source region being at the level within a depth of the recess, (c) a first insulating film formed on an inner wall of the recess, (d) a gate electrode formed in the recess and having a thickness smaller than a depth of the recess, and (e) a second insulating film formed on the gate electrode.

For instance, the base region may be formed on the drain region, and the source region may be formed at a surface of the base region.

It is preferable that the drain region is a lightly doped one, and the source region is a heavily doped one. It is also preferable that the second insulating film is LOCOS oxide film, and has such a thickness that the second insulating film is on a level with the semiconductor region or epitaxial layer.

The second insulating film may be employed as a mask for forming the source region, and for exposing the base region and the source region.

The semiconductor device may further include a source electrode formed over the base region and the source region.

The semiconductor region or substrate may be heavily doped and have a first electrical conductivity, wherein the semiconductor device constitutes MOSFET, for instance. The semiconductor region or substrate may be heavily doped and have a second electrical conductivity, wherein the semiconductor device constitutes MOSFET which modulates conductivity thereof, for instance.

In another aspect of the present invention, there is provided a method of fabricating a semiconductor device, including the steps of (a) forming a first insulating film on a semiconductor region, (b) forming the semiconductor region with a recess, (c) forming a gate insulating film on an inner wall of the recess, (d) forming a polysilicon film so that the recess is filled with the polysilicon film, (e) etching back the polysilicon film so that a gate electrode having a thickness smaller than a depth of the recess is formed in the recess, (f) oxidizing the gate electrode at its surface with the first insulating film being used as a mask, to thereby form a third insulating film on the gate electrode, (g) forming a base region at a surface of the semiconductor region with the third insulating film being used as a mask so that the base region has a thickness smaller than a depth of the recess, the base region having an electrical conductivity different from that of the semiconductor region, (h) forming a source region at a surface of the base region with the third insulating film being used as a mask, the source region having the same electrical conductivity as that of the semiconductor region, (i) exposing the base and source regions with the third insulating film being used as a mask, and (j) forming a source electrode over the third insulating film, the base region, and the source region.

There is further provided a method of fabricating a semiconductor device, including the steps of (a) sequentially forming an epitaxial layer and a first insulating film on a semiconductor substrate, (b) forming the epitaxial layer with a recess, (c) forming a gate insulating film on an inner wall of the recess, (d) forming a polysilicon film so that the recess is filled with the polysilicon film, (e) etching back the polysilicon film so that a gate electrode having a thickness smaller than a depth of the recess is formed in the recess, (f) oxidizing the gate electrode at its surface with the first insulating film being used as a mask, to thereby form a third insulating film on the gate electrode, (g) forming a base region at a surface of the epitaxial layer with the third insulating film being used as a mask so that the base region has a thickness smaller than a depth of the recess, the base region having an electrical conductivity different from that of the epitaxial layer, (h) forming a source region at a surface of the base region with the third insulating film being used as a mask, the source region having the same electrical conductivity as that of the epitaxial layer, (i) exposing the base and source regions with the third insulating film being used as a mask, and (j) forming a source electrode over the third insulating film, the base region, and the source region.

It is preferable that the source region is formed to be a heavily doped one in the step (h). For instance, the third insulating film may be formed as LOCOS oxide film. It is preferable that the third insulating film is formed in the step (f) having such a thickness that the third insulating film is on a level with the epitaxial layer. It is preferable that the polysilicon film is etched back in the step (e) so that the third insulating film formed in the step (f) could have such a thickness that the third insulating film is on a level with the epitaxial layer.

In accordance with the present invention, the polysilicon film remains unetched having a certain thickness in the recess in self-aligned manner by etching back the polysilicon film. Thus, it is possible to form a gate electrode without carrying out a photolithography step.

In addition, it is possible to form the second (or third in the method) insulating film on the thus formed gate electrode in self-aligned manner without carrying out a photolithography step.

Furthermore, since a contact is formed on the source region in self-aligned manner with the second (or third in the method) insulating film being used as a mask, it is no longer necessary carry out photolithography steps for forming a gate electrode and for forming a contact on the source region, which means that it is no longer necessary to have a registration margin for a photoresist mask used for carrying out those steps.

As a result, the present invention makes it possible to form a source region smaller in a planar size, and hence it is also possible to form a unit cell in a smaller size, which ensures greater integration of devices than conventional semiconductor devices, and reduction in on-resistance.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 3:
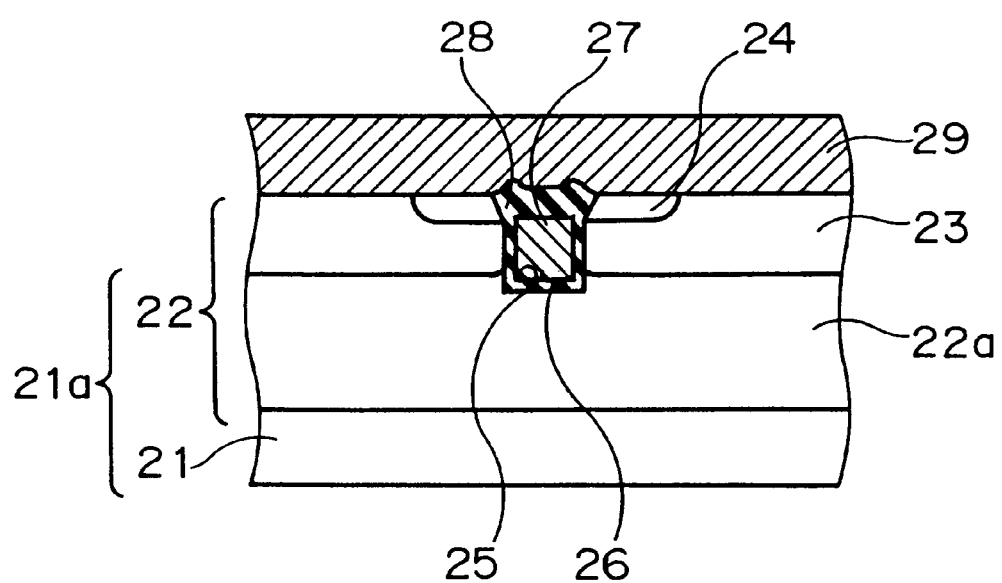
FIG. 3 is a cross-sectional view of MOSFET in accordance with the preferred embodiment of the present invention.

FIG. 3 illustrates MOSFET in accordance with the preferred embodiment of the present invention.

The illustrated MOSFET includes a semiconductor region 21a comprising a heavily doped $n^+$ semiconductor substrate 21, and an epitaxial layer 22 formed on the $n^+$ semiconductor substrate 21. The epitaxial layer 22 is formed at a surface thereof with a recess 25.

The epitaxial layer 22 is formed at a surface thereof with a p-type base region 23 having a shallower junction depth than a depth of the recess 25. The p-type base region 23 has formed with at a surface thereof with $n^+$ source regions 24 sandwiching the recess 25 therebetween. The epitaxial layer 22 other than the base region 23 and the source region 24 constitutes a drain region 22a. A horizontally extending interface between the drain region 22a and the base region 23 is at the level within a depth of the recess 25. Similarly, a horizontally extending interface between the base region 23 and the source region 24 is at the level within a depth of the recess 25.

The recess 25 is covered at an inner wall thereof with a gate oxide film 26. A gate electrode 27 is formed in the recess 25. The gate electrode 27 has a thickness smaller than a depth of the recess 25. Over the gate electrode 27 is formed LOCOS oxide film 28 so that the rest of the recess 25 is filled with LOCOS oxide film 28. LOCOS oxide film 28 is designed to have a surface almost on a level with a surface of the epitaxial layer 22.

Over the epitaxial layer 22 and LOCOS oxide film 28 is formed a source electrode 29 which makes electrical contact with both the source region 24 and the base region 23 at surfaces thereof.

Figure 1:
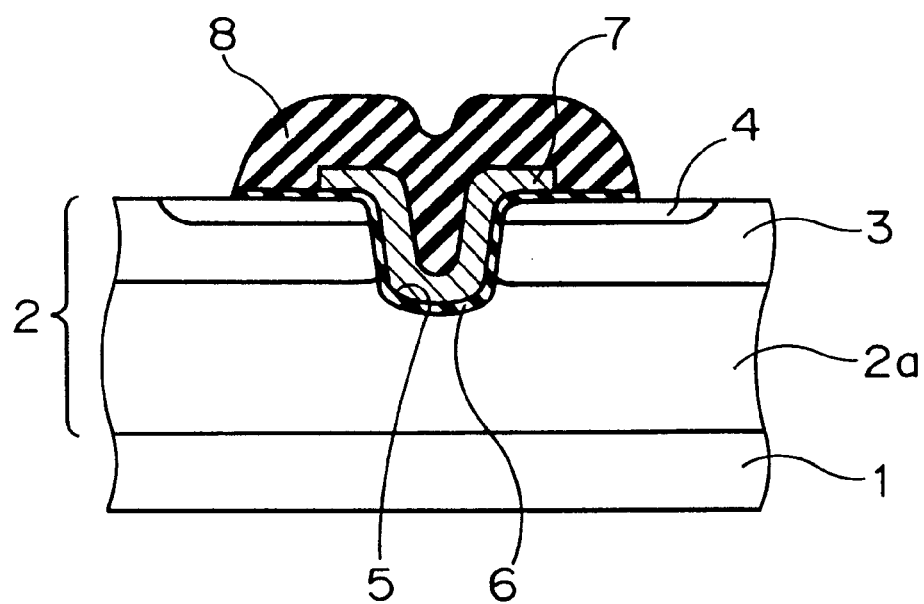
FIG. 1 is a cross-sectional view of a conventional MOSFET.
Figure 2A:
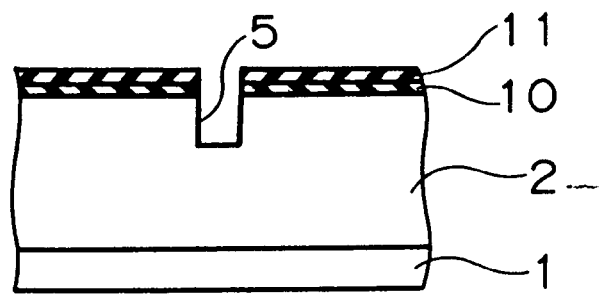
FIGS. 2A to 2C are cross-sectional views each illustrating respective step of a method of fabricating the conventional MOSFET illustrated in FIG. 1.
Figure 2B:
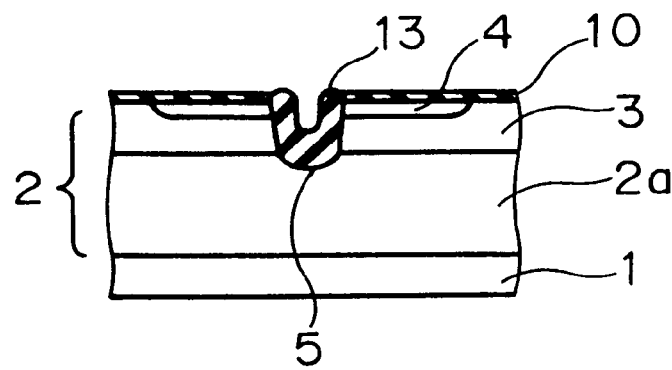
Figure 2C:
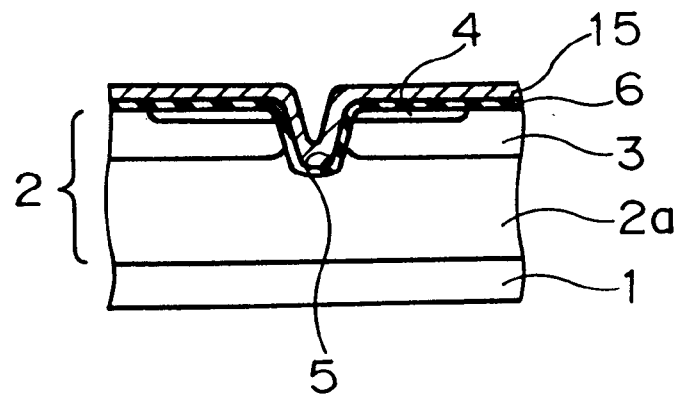

A method of fabricating the above-mentioned MOSFET illustrated in FIG. 1 is explained hereinbelow with reference to FIGS. 4A to 4D.

Figure 4A:
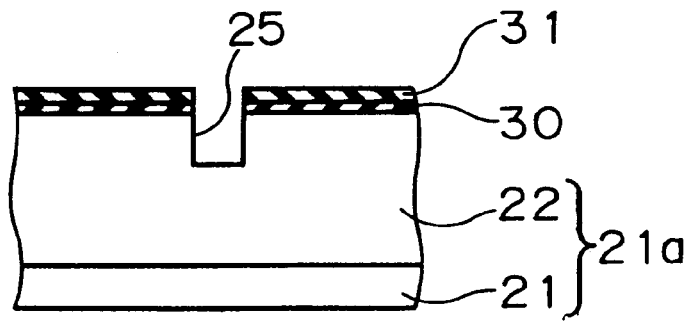
FIGS. 4A to 4D are cross-sectional views each illustrating respective step of a method of fabricating MOSFET illustrated in FIG. 3.

First, as illustrated in FIG. 4A, the $n^+$ semiconductor substrate 21 is formed at a surface thereof with the epitaxial doped 22 containing n-type impurities at a low concentration. Then, the epitaxial layer 22 is formed at a surface thereof with the silicon dioxide film 30 by thermal oxidation. Then, a silicon nitride film 31 is formed all over the silicon dioxide film 10 by chemical vapor deposition (CVD). The silicon nitride film 31 acts as a mask for preventing growth of the silicon dioxide film 30. Thereafter, the silicon nitride film 31, the silicon dioxide film 30, and the epitaxial layer 22 are etched at a selected region by photolithography and dry etching to thereby form a recess 25 reaching an intermediate depth of the epitaxial layer 22.

Figure 4B:
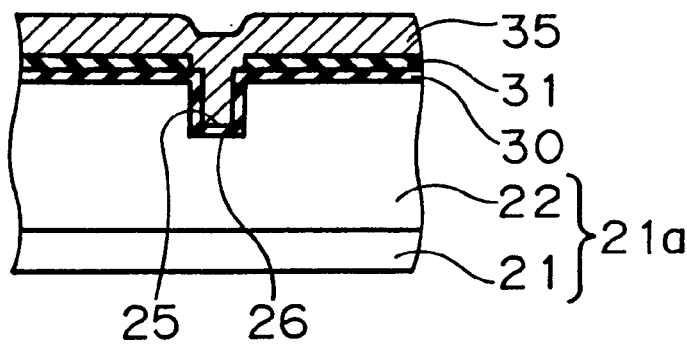

Then, as illustrated in FIG. 4B, the recess 25 is thermally oxidized to thereby form a gate oxide film 26 on an inner wall of the recess 25. Then, a polysilicon film 35 is formed all over the epitaxial layer 22 by CVD so that the recess 25 is filled with the polysilicon film 35.

Figure 4C:
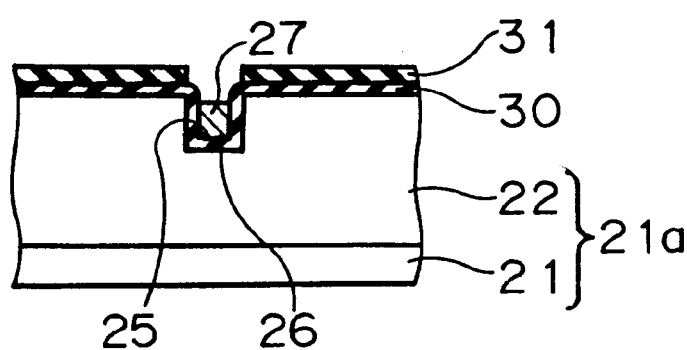

Then, as illustrated in FIG. 4C, the polysilicon film 35 is etched back by dry etching to thereby have such a thickness that LOCOS oxide film 28 which will be formed in a later step would have a surface on a level with a surface of the epitaxial layer 22. As a result, there is formed a gate electrode 27 in the recess 25.

Figure 4D:
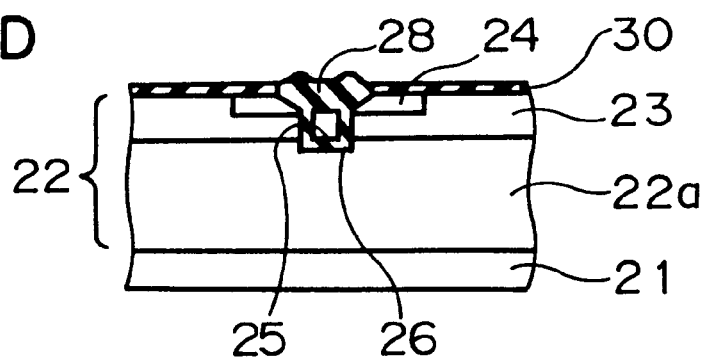

Then, as illustrated in FIG. 4D, the gate electrode 27 is thermally oxidized at a surface thereof with the silicon nitride film 31 being used as a mask, to thereby form LOCOS oxide film 28 at a surface of the gate electrode 27. The thus formed LOCOS oxide film 28 has a surface almost on a level with the epitaxial layer 22. At the same time with the formation of LOCOS oxide film 28, an upper edge of the recess 25 is eaten away by LOCOS oxide film 28, and hence, becomes rounded.

Then, the silicon nitride film 31 is completely removed by wet etching. Then, the epitaxial layer 22 is ion-implanted with boron with LOCOS dioxide film 28 being used as a mask, followed by annealing for thermal diffusion of boron to thereby form the p-type base region 23 in the epitaxial layer 22.

Then, arsenic is ion-implanted into the base region 23 with both LOCOS dioxide film 28 and a photoresist film (not illustrated) being used as a mask, followed by annealing for thermal diffusion of arsenic to thereby form the $n^+$ source region 24 in the p-type base region 23. The epitaxial layer 22 other than the p-type base region 23 and the $n^+$ source region 24 constitutes the $n^-$ drain region 22a.

Then, as illustrated in FIG. 3, the silicon dioxide film 30 is removed by wet etching with LOCOS oxide film 13 being used as a mask, to thereby expose the base region 23 and the source region 24. Then, the epitaxial layer 22 is entirely covered with an aluminum film by sputtering, followed by removal of the aluminum film in a selected region by photolithography and dry etching, to thereby form a source electrode 29 making electrical contact with both the base region 23 and the source region 24.

In accordance with the above-mentioned method, the polysilicon film 35 remains unetched in the recess 25 in self-aligned manner, having a certain thickness smaller than a depth of the recess 25, by etching back the polysilicon film 35, when the gate electrode 27 is to be formed. Thus, it is possible to form the gate electrode 27 without carrying out a photolithography step.

In addition, it is possible to form the source region 24 on the thus formed gate electrode 27 with LOCOS oxide film 28, which have been formed in self-aligned fashion, being used as a mask. That is, the gate electrode 27 can be formed without carrying out a photolithography step. Hence, it is no longer necessary to have a registration margin between the source region 24 and the gate electrode 27 unlike the conventional method mentioned earlier.

Furthermore, it is also possible to form a contact on the source region 24, which is to be used when the source electrode 29 on the source region 24, with LOCOS film 28 being used as a mask. Hence, it is no longer necessary to carry out a photolithography step for forming the contact, which ensures that it is no longer necessary to have a registration margin therefor. As a result, it is possible to form the source region 24 smaller in a planar size, which ensures that it is possible to form a unit cell in a smaller size.

In the above-mentioned method, the source region 24 and the base region 23 may be formed prior to the formation of the recess 25. However, when the source region 24 having a shallow junction depth is formed, it would be quite difficult to control a junction depth of the source region 24 because of a thermal oxidation step to be carried out later for forming LOCOS oxide film 28.

In the above-mentioned embodiment, the semiconductor region 21a is comprised of the semiconductor substrate 21 and the epitaxial layer 22. However, it should be noted that the semiconductor region 21a might be comprised only of the semiconductor region 21.

In the above-mentioned embodiment, the semiconductor substrate 21 is designed to be heavily doped and have an n-type conductivity. However, it should be noted that the semiconductor substrate 21 may be designed to have a p-type conductivity, in which case, the semiconductor device constitutes MOSFET which can modulate conductivity thereof.

It would be obvious for those skilled in the art that n- and p-type conductivity mentioned in the above-mentioned embodiment may be changed into p- and n-type, respectively.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 9-231888 filed on Aug. 28, 1997 including specification, claims, drawings and summary is incorporated herein by reference in its entirety.

What is claimed is:

1. A method of fabricating a semiconductor device, comprising the steps of:

(a) forming a first insulating film on a semiconductor region;

(b) forming said semiconductor region with a recess;

(c) forming a gate insulating film on an inner wall of said recess;

(d) forming a polysilicon film so that said recess is filled with said polysilicon film;

(e) etching back said polysilicon film so that a gate electrode having a thickness smaller than a depth of said recess is formed in said recess;

(f) oxidizing said gate electrode at its surface with said first insulating film being used as a mask, to thereby form a second insulating film on said gate electrode;

(g) forming a base region at a surface of said semiconductor region with said second insulating film being used as a mask so that said base region has a thickness smaller than a depth of said recess, said base region having an electrical conductivity different from that of said semiconductor region;

(h) forming a source region at a surface of said base region with said second insulating film being used as a mask, said source region having the same electrical conductivity as that of said semiconductor region;

(i) exposing said base and source regions with said second insulating film being used as a mask; and (j) forming a source electrode over said second insulating film, said base region, and said source region.

2. The method as set forth in claim 1, wherein said source region is formed to be a heavily doped one in said step (h).

3. The method as set forth in claim 1 wherein said second insulating film is LOCOS oxide film.

4. The method as set forth in claim 1, wherein said second insulating film is formed in said step (f) having such a thickness that said second insulating film is on a level with said semiconductor region.

5. The method as set forth in claim 1, wherein said polysilicon film is etched back in said step (e) so that said second insulating film formed in said step (f) has a thickness such that said second insulating film is on a level with a top surface of said semiconductor region.

6. A method of fabricating a semiconductor device, comprising the steps of:

(a) sequentially forming an epitaxial layer and a first insulating film on a semiconductor substrate;

(b) forming said epitaxial layer with a recess;

(c) forming a gate insulating film on an inner wall of said recess;

(d) forming a polysilicon film so that said recess is filled with said polysilicon film;

(e) etching back said polysilicon film so that a gate electrode having a thickness smaller than a depth of said recess is formed in said recess;

(f) oxidizing said gate electrode at its surface with said first insulating film being used as a mask, to thereby form a second insulating film on said gate electrode;

(g) forming a base region at a surface of said epitaxial layer with said second insulating film being used as a mask so that said base region has a thickness smaller than a depth of said recess, said base region having an electrical conductivity different from that of said epitaxial layer;

(h) forming a source region at a surface of said base region with said second insulating film being used as a mask, said source region having the same electrical conductivity as that of said epitaxial layer; (i) exposing said base and source regions with said second insulating film being used as a mask; and (j) forming a source electrode over said second insulating film, said base region, and said source region.

7. The method as set forth in claim 6, wherein said source region is formed to be a heavily doped one in said step (h).

8. The method as set forth in claim 6, wherein said second insulating film is LOCOS oxide film.

9. The method as set forth in claim 6, wherein said second insulating film is formed in said step (f) having such a thickness that said second insulating film is on a level with a top surface of said epitaxial layer.

10. The method as set forth in claim 6, wherein said polysilicon film is etched back in said step (e) so that said second insulating film formed in said step (f) has a thickness such that said second insulating film is on a level with a top surface of said epitaxial layer.

* * * * *